United States Patent
Fujita et al.

(10) Patent No.: US 7,685,390 B2
(45) Date of Patent: Mar. 23, 2010

(54) STORAGE SYSTEM

(75) Inventors: Takahiro Fujita, Fujisawa (JP); Akihiro Mannen, Kawasaki (JP); Masaaki Hosouchi, Zama (JP); Yuichi Yagawa, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 602 days.

(21) Appl. No.: 11/608,945

(22) Filed: Dec. 11, 2006

(65) Prior Publication Data
US 2008/0126677 A1  May 29, 2008

(30) Foreign Application Priority Data
Nov. 2, 2006 (JP) ............................. 2006-298669

(51) Int. Cl.
G06F 13/00 (2006.01)
G06F 13/28 (2006.01)
G06F 12/00 (2006.01)
G06F 3/00 (2006.01)
G06F 5/00 (2006.01)

(52) U.S. Cl. .................... 711/163; 711/103; 710/36; 710/200; 726/2

(58) Field of Classification Search .................. None
See application file for complete search history.

(56) References Cited

U.S. PATENT DOCUMENTS

| 4,641,240 A * | 2/1987 | Boram ..................... 705/12 |
| 7,479,798 B1 * | 1/2009 | Reese ........................ 326/8 |
| 2005/0007685 A1 * | 1/2005 | Winarski et al. .......... 360/60 |
| 2005/0210211 A1 | 9/2005 | Kodama |
| 2005/0223167 A1 | 10/2005 | Nishimoto et al. |
| 2005/0262300 A1 | 11/2005 | Mannen et al. |

FOREIGN PATENT DOCUMENTS

| JP | 2005-267602 | 9/2005 |
| JP | 2005-284816 | 10/2005 |
| JP | 2005/338945 | 12/2005 |

* cited by examiner

*Primary Examiner*—Matt Kim
*Assistant Examiner*—Edward J Dudek
(74) *Attorney, Agent, or Firm*—Brundidge & Stanger, P.C.

(57) ABSTRACT

A storage system where storage devices themselves have WORM functionality that can be set at any time. The storage system includes storage devices, and a controller for controlling data transmission between the storage devices and an information processor. Each storage device has a storage cell and a fuse at a midpoint on a write control line, and the controller applies a voltage to the fuse to blow it to set WORM for the storage cell.

8 Claims, 17 Drawing Sheets

FIG.4

| STORAGE AREA | PG | ATTRIBUTE | CAPACITY |
|---|---|---|---|
| LDEV1 | PG1 | RW | 300 |
| LDEV2 | PG1 | RW | 400 |
| LDEV3 | PG3 | RW | 100 |
| LDEV4 | PG4 | R | 200 |
| LDEV5 | PG5 | RW | 300 |

FIG.5

| PG | RAID Level | CAPACITY |
|---|---|---|
| PG1 | NO RAID | 800 |
| PG2 | RAID 1 | 800 |
| PG3 | NO RAID | 400 |
| PG4 | RAID 5 | 800 |

FIG.9

| STORAGE DEVICE | ATTRIBUTE | ATTRIBUTE CHANGE DATE | RETENTION TIME LIMIT | WORM FUNCTION | PG | CAPACITY |
|---|---|---|---|---|---|---|
| PDEV1 | RW | NONE | NONE | NONE | PG1 | 400 |
| PDEV2 | RW | NONE | NONE | NONE | PG1 | 400 |
| PDEV3 | RW | NONE | NONE | SET | PG2 | 400 |
| PDEV4 | RW | NONE | NONE | SET | PG2 | 400 |
| PDEV5 | R | 2006/07/12 | 2016/07/12 | SET | PG3 | 400 |
| PDEV6 | S | 2006/07/12 | NONE | SET | N/A | 200 |
| PDEV7 | RW | NONE | NONE | SET | N/A | 400 |
| PDEV8 | RW | NONE | NONE | SET | PG4 | 200 |
| PDEV9 | RW | NONE | NONE | SET | PG4 | 200 |
| PDEV10 | RW | NONE | NONE | SET | PG4 | 200 |
| PDEV11 | RW | NONE | NONE | SET | PG4 | 200 |

FIG.10

| STORAGE AREA | PG | STORAGE DEVICE | USED CAPACITY IN STORAGE DEVICE |
|---|---|---|---|
| LDEV1 | PG1 | PDEV1 | 300 |
| LDEV2 | PG1 | PDEV1 | 100 |
| LDEV2 | PG1 | PDEV2 | 300 |
| LDEV3 | PG2 | PDEV3 | 100 |
| LDEV3 | PG2 | PDEV4 | 100 |
| LDEV4 | PG3 | PDEV5 | 200 |
| LDEV5 | PG4 | PDEV8 | 100 |
| LDEV5 | PG4 | PDEV9 | 100 |
| LDEV5 | PG4 | PDEV10 | 100 |
| LDEV5 | PG4 | PDEV11 | 100 |

STORAGE SYSTEM

CROSS-REFERENCES TO RELATED APPLICATIONS

This application relates to and claims priority from Japanese Patent Application No. 2006-298669, filed on Nov. 2, 2006, the entire disclosure of which is incorporated herein by reference.

BACKGROUND

1. Field of the Invention

The invention relates in general to a storage system, and in particular to a storage system using semiconductor memories, such as flash memories, for storage devices.

2. Description of Related Art

Storage control systems include storage systems and information processors that serve as host systems for the storage systems. The storage systems house storage devices such as hard disk drives in arrays, thereby providing a sufficient storage capacity to the information processors. The information processors are connected to the storage systems via SANs or the like and write data in, and read the written data from, the storage devices. The storage systems include controllers for controlling data transmission between the storage devices and information processors.

Because the data in the hard disk drive can be rewritten whenever necessary, there is a risk of it being tampered with. Conventional art for storage systems includes those with a data rewrite protection function. The data rewrite protection function is called WORM (Write Once Read Many).

For example, Japanese Patent Laid-Open Publication No. 2005-267602 discloses a storage system capable of protecting data stored in the volumes in the storage system. This storage system includes storage media for providing volumes, a disk controller for controlling the storage system, and a WORM (recordable) structure table having a plurality of entries where the areas that are write-protected, from among a plurality of areas in volumes, are displayed with next-write-area indicating pointers, so that it can manage these protected areas, thereby implementing the WORM functionality. The entries in the WORM structure table indicate the write-protected areas in the volumes, which are defined by top offsets and end offsets.

Japanese Patent Laid-Open Publication No. 2005-284816 discloses a storage system that realizes WORM functionality with its entire system including cache memory. This storage system includes storage devices for storing write data received from computers, cache memory, and a controller that controls the input/output of data to/from the storage devices. The controller judges whether or not write data has already been written in a write destination storage area designated by a write command from the computer, and if write data has not yet been written in the write destination storage area, the controller receives the write data in accordance with the write command and stores it in the cache memory.

Japanese Patent Laid-Open Publication No. 2005-338945 also discloses a storage system realizing WORM functionality. In this storage system, when a data write request is received from a computer, whether or not write target data sent from the computer can be written is judged based on the content indicated in write protection information. If the write target data can be written, a guarantee code is created for the sent data; write protection information indicating that the area the write target data is to be stored in is a write-protected area is created; the created write protection information is stored in the guarantee code; the guarantee code storing the write protection information is given to the area the write target data received from the computer is to be stored in; and the data having the guarantee code storing the write protection information is stored in the cache memory and/or disks. If the write target data from the computer cannot be written, the computer is notified to that effect.

However, in these conventional storage systems, the storage devices themselves do not have the WORM functionality; instead the management software provided by the storage systems' vendors provides the WORM functionality to the storage systems. Accordingly, for those conventional storage systems, no consideration has been made for physical prevention of data tampering in storage devices such as CD-Rs and DVD-Rs.

In storage systems, because the data issued from information processors and written in storage devices requires frequent updating, it is a matter of course that the storage resources cannot be composed only of one-time recordable storage devices. Therefore, one-time recordable storage devices and anytime-rewritable storage devices are used together and data that should be protected from being tampered with is migrated to the recordable storage devices; however, such use of recordable storage resources as storage resources is not efficient.

In order to solve these problems, this invention aims to provide a storage system where storage devices themselves have WORM functionality that an administrator can set as required.

SUMMARY

This invention provides a storage system where data sent from an information processor can be written in a storage device, but when writing of new data or updating of the written data in the storage device is prohibited, data write protection can be set physically and irreversibly for the storage device.

A first embodiment of this invention is a storage system having a storage device and a controller that controls data transmission between the storage device and an information processor. The storage device includes a storage area and an element capable of setting WORM for the storage area; and the controller outputs to the storage device a control signal for irreversibly setting WORM for the storage area using the element.

A second embodiment of this invention is a storage system having a storage device and a first controller that controls data transmission between the storage device and an information processor. The storage device includes: a storage area; a control circuit for controlling the writing of data to the storage area and the reading of the data from the storage area; a second controller for outputting, to the control circuit through a first control line, a first control signal for executing data write; and outputting, to the control circuit through a second control line, a second control signal for executing data read; a disconnecting element for disconnecting the control line, that is located at a midpoint on at least the first control line, from among the first and second control lines; and a drive circuit for driving the disconnecting element. Based on a command from the first controller, the second controller outputs to the drive circuit a third control signal for disconnecting the control line using the disconnecting element.

According to this invention, a storage system where storage devices themselves have WORM functionality that an administrator can as required can be provided.

BRIEF DESCRIPTION OF THE DRAWINGS

FIG. 4 is a management table for logical volumes (LDEVs).

FIG. 5 is a management table for parity groups.

FIG. 9 is a management table for storage devices.

FIG. 10 is a mapping management table defining the correspondence relationships between the storage devices and logical volumes.

DETAILED DESCRIPTION OF PREFERRED EMBODIMENTS

Figure 1:
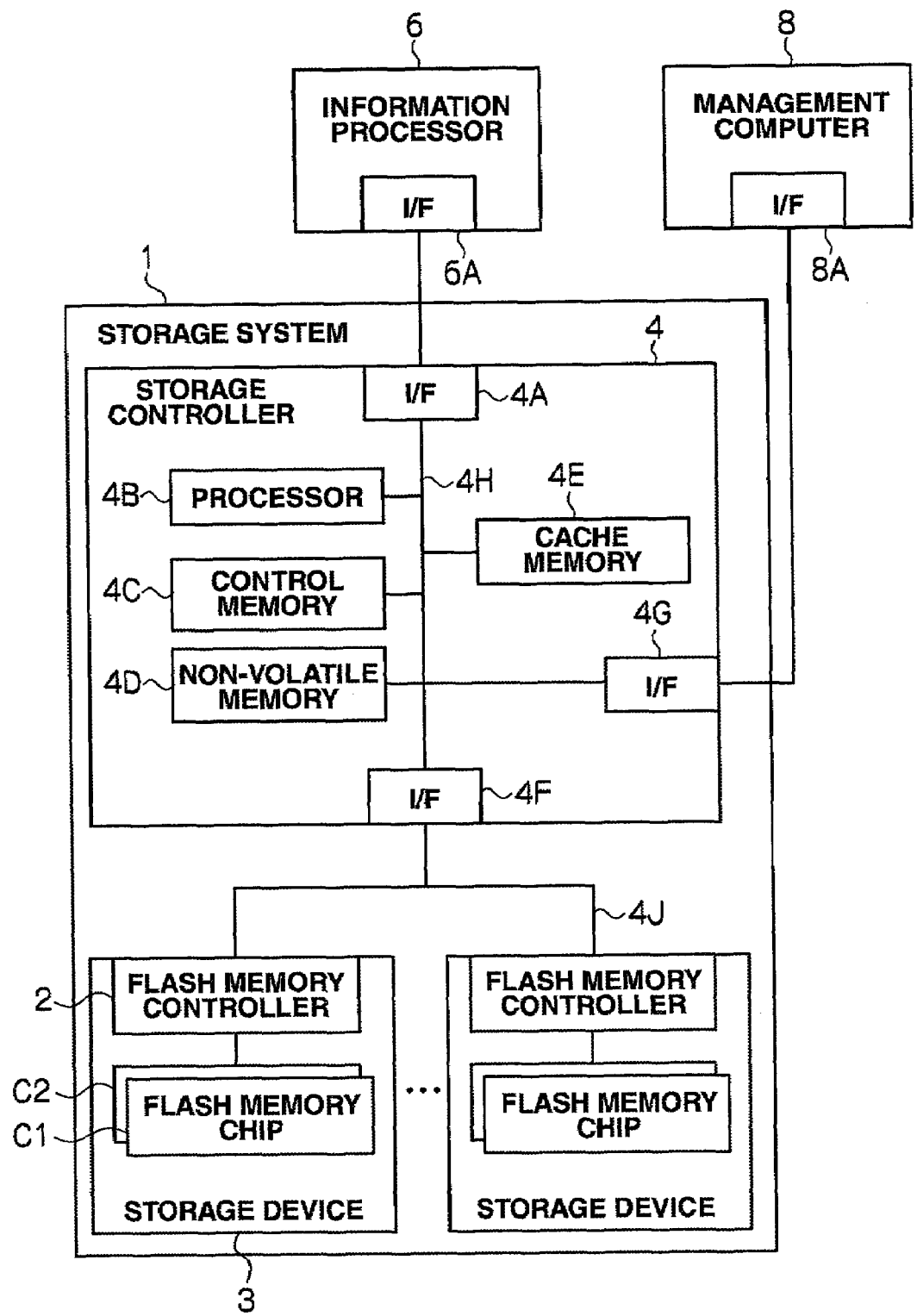
FIG. 1 is a hardware block diagram of a storage control system including a storage system according to this invention, a host system, and a management computer.

FIG. 1 shows a storage control system including a storage system according to this invention. This storage control system is composed of an information processor 6 as a host system, a storage system 1, and a management computer 8. The information processor 6 serving as a server or host for a user's client computer, provides applications for the services required by the user to the client computer.

The storage system 1 includes a plurality of storage devices (storage apparatuses) 3 and a storage controller 4 that executes various control for data transmission between the storage devices 3 and information processor 6. The storage controller 4 includes a processor 4B, non-volatile memory 4D storing micro programs run by the processor 4B, control memory 4C storing a control table the processor 4B refers to when executing various controls. It also has cache memory 4E, which is a storage area for temporarily storing data written in the storage devices 3.

The I/F (6A) of the information processor 6 is connected to an I/F (4A) of the internal bus 4H of the storage controller 4. The I/F (8A) of the management computer 8 is connected to another I/F (4G) of the bus 4H. Still another I/F (4F) of the bus 4H is connected to a plurality of storage devices 3 via a bus 4J. The storage controller 4 corresponds to the first controller described in the claims of this application. The management computer 8 is partly responsible for the storage control, for example, it sets control tables in the control memory 40. Accordingly, the management computer 8 may also correspond to the first controller described in claim 1. Each storage device 3 includes flash memory chips C1, C2 . . . Cn as memory elements and a controller (flash memory controller) 2 for controlling the respective elements. This flash memory controller 2 corresponds to the second controller described in the claims.

Figure 2:
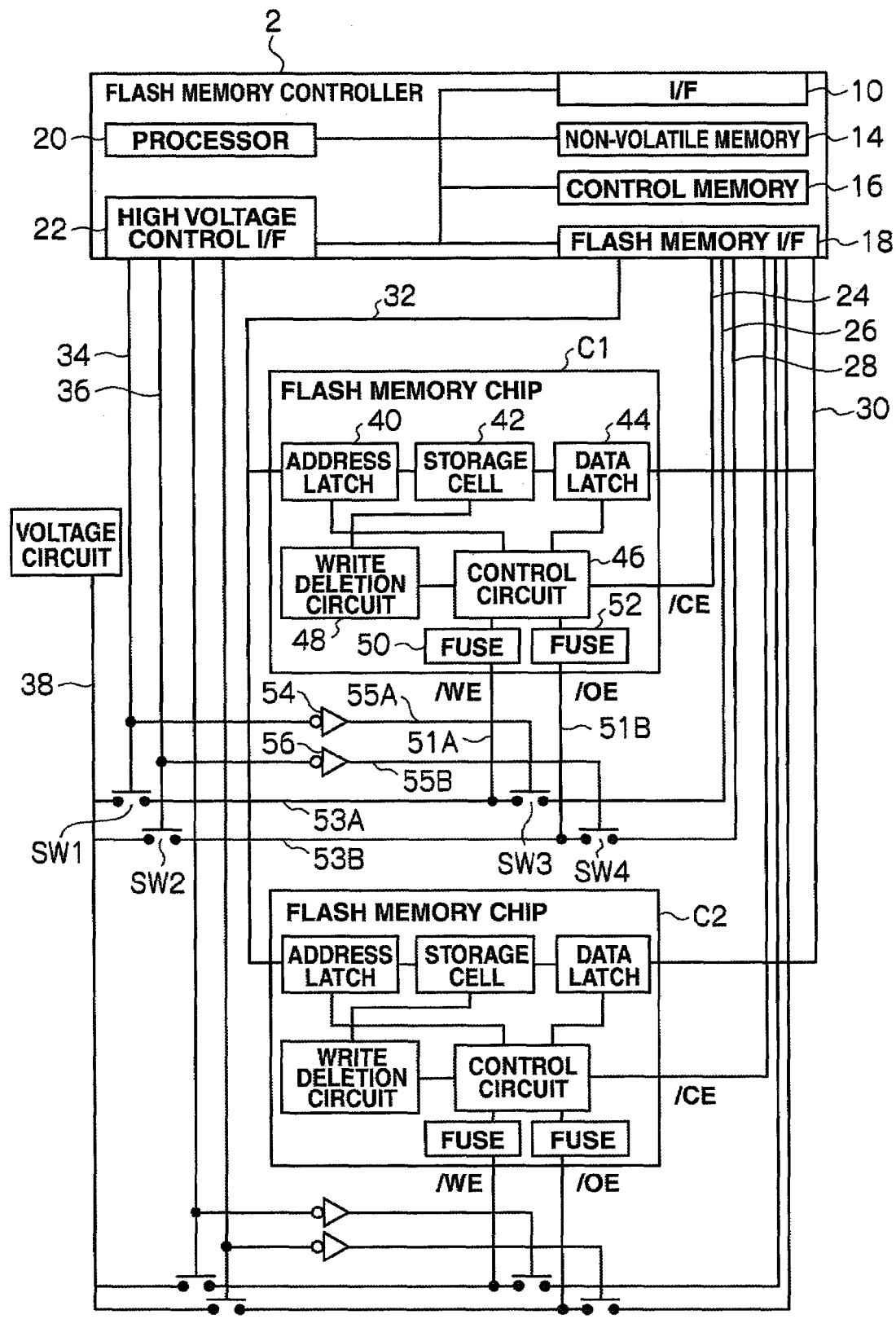
FIG. 2 is a hardware block diagram showing the detailed structure of a storage device.

FIG. 2 shows the detailed structure of the storage device 3. The flash memory chip C1 (C2) is a memory element with the WORM functionality. The WORM functionality is realized by a fuse 50 being provided at a midpoint on the write control line extending between the flash memory controller 2 and the flash memory chip; a high-voltage circuit for supplying a voltage high enough to blow the fuse 50 is provided for the fuse 50; and, after the fuse 50 is blown, a write enable signal not being sent from the flash memory controller 2 to the flash memory chip.

The flash memory chip is composed of: an address latch circuit 40 for latching an address; a storage cell 42 which is a storage area for storing data in a designated address; a data latch circuit 44 for latching data; a control circuit 46 for controlling the address latch circuit 40 and data latch circuit 44; a write deletion circuit 48 for deleting write data in the storage cell 42; first fuse 50 provided at a midpoint on the write control line 51A extending toward the control circuit 46; and a second fuse 52 provided at a midpoint on a read control line 51B. These fuses may instead be provided outside the flash memory chip.

The flash memory controller 2 includes: a processor 20; non-volatile memory 14 storing micro programs run by the processor 20; control memory 16 for the storing control tables, etc., the processor 20 refers to when running the micro programs; a high-voltage control I/F 22 for outputting control signals in order to control high voltages applied to the fuses 50 and 52; an I/F 18 for outputting various control signals to the flash memory chips; and an I/F 10 for connection with the I/F 4F in the storage controller 4.

An address signal line 32 extends from the flash memory I/F 18 to the address latch circuit 40. The processor 20 in the flash memory controller 2 outputs a storage cell-address-designated address signal to the address latch circuit 40 through this address signal line 32.

Reference numeral 30 indicates a data line. The data line 30 extends from the flash memory I/F 18 to the data latch circuit 44. The address latch circuit 40 latches addresses sent through the address line 32. The data latch circuit 44 latches data sent through the data line 30 or the data read from the storage cell.

The control circuit 46 controls the address latch circuit 40 and data latch circuit 44, writes data corresponding to a latched address in the storage cell 42, or reads the data stored in the latched address from the storage cell 42.

Reference numeral 24 indicates a control line through which the flash memory controller 2 outputs control signals to select a flash memory chip (C1, C2 . . . Cn). Having received a request from the processor 4B in the storage controller 4, the processor 20 selects a data-input/output target chip from among the plurality of flash memory chips, and activates that chip. It also outputs a chip enable signal (/CE) to the control circuit 46 in the selected chip via the flash memory I/F 18.

Reference numeral 51A is a control line through which write enable signals (/WE) are output to the control circuit 46. This write enable signal line 51A is connected to a line 26 extending from the flash memory I/F 18. The processor 20 outputs write enable signals to the control line 51A via this line 26.

Reference signal 51B is a control line through which output enable signals (/OE) are output to the control circuit 46. This output enable signal line 51B is connected to a line 28 extending from the flash memory I/F 18. The processor 20 outputs output enable signals to the control line 51B via this line 28.

Reference numeral SW3 is a switch provided between the signal line 26 and write enable signal line 51A. Reference numeral SW4 is a switch provided between the signal line 28 and the output enable signal line 51B. The write enable signal line 51A is connected to a first high voltage line 53A connected to an output line 38 extending from the high voltage circuit. There is a switch SW1 between the first high voltage line 53A and output line 38 and this switch SW1 is connected to the control line 34. There is a by-pass line 55A between the control line 34 and switch SW3 and there is a first inverter 54 at a midpoint on the by-pass line 55A.

The read control line 51B is connected to a second high voltage line 53B connected to the output line 38 extending from the high voltage circuit. There is a switch SW2 between the second high voltage line 53B and output line 38 and this switch SW2 is connected to the control line 36. There is a second by-pass line 55B between the control line 36 and switch SW4 and there is a second inverter 56 at a midpoint on the by-pass line 55B.

A first fuse 50 is located between the write enable signal line 51A and control circuit 46; and a second fuse 52 is located between the output enable signal line 51B and control circuit 46. These fuses are examples of the disconnecting elements described in the claims. They are blown when being a high voltage from the high voltage circuit is applied, physically and irreversibly disconnecting the respective control lines. The processor 20 outputs control signals to the switches SW1 and SW2 for controlling the opening and closing of them.

Operations performed by the circuits in FIG. 2 when writing/reading data to/from a flash memory chip are explained next. The statuses of the respective switches during those operations are as follows. The processor 20 outputs a control signal "L" to the control lines 34 and 36 to open the switches SW1 and SW2. Both switches are then opened so that no voltage is applied from the voltage circuit to the fuses 50 and 52. The level of the voltage from the voltage circuit may be low, as long as it can blow the fuses. Because the level of the voltage from the voltage circuit is higher than that of the control signal, it is described as a "high voltage".

Meanwhile, a control signal "H" is supplied from the inverter 54 to the switch SW3 and also from the inverter 56 to the switch SW4, closing them. As a result, the flash memory controller 2 can output a write enable signal) (/WE) and output enable signal (/OE) to the control circuit 46. At this stage, because the switches SW1 and SW2 are opened, high voltages will not be applied to the flash memory controller 2.

Having received a data write command or data read command from the processor 4B in the storage controller 4, the flash memory controller 2 selects a target flash memory chip. Then it outputs a chip enable signal (/CE) to that control circuit 46 in the selected flash memory chip. Then, when the processor 20 outputs a write enable signal (/WE) to the control circuit 46 via the line 26, switch SW3, write control line 51A and fuse 50, the control circuit 46 writes the data latched by the data latch circuit 44 in the storage cell at the address latched by the address latch circuit 40.

The processor 4B reads the data sent from the information processor 6 and stored in the cache memory 4E; and sends it to the flash memory controller 2. The processor 20 in the flash memory controller 2 selects a specified flash memory chip; sends a chip enable signal to the control circuit 46 in that chip; and has the data latch circuit 44 in that chip latch the data When the processor 20 outputs an output enable signal (/OE) to the control circuit 46 via the line 28, switch SW4, read control line 51B and fuse 52, the control circuit 46 reads from the storage cell 42 the data stored in the address latched by the address latch circuit 40, latches it with the data latch circuit 44, and outputs the latched data to the processor 20 via the flash memory I/F 18. The processor 20 then sends this data to the storage controller 4. The processor 4B then writes it in the cache memory 4E. Having received the data read request from the information processor 6, the processor 4B reads the data from the cache memory 4E and outputs it to the information processor 6.

Operations performed by the circuits in FIG. 2 when the flash memory controller 2 sets WORM for a flash memory chip in response to a command from the storage controller 4 are explained next. Setting WORM for a flash memory chip involves blowing the fuse 50 located at a midpoint on the write control line 51A and so disabling writing and updating of data in the storage cell 42. Incidentally, it is also possible to disable reading of data from the storage cell 42 by blowing the fuse 52 located at a midpoint on the read control line 51B. This equals shredding the data in the storage cell 42. For a non-WORM-set flash memory chip, data can be shredded by updating all the memory areas in the storage cell 42 with a predetermined value. In other words, blowing the fuse 52 is normally performed for a flash memory chip whose fuse 50 is blown.

In order to set WORM for a flash memory chip in the storage system 1, the processor 20 outputs a control signal "H" to the control line 34. As a result, the switch SW1 closes. Meanwhile, the inverter 54 outputs a control signal "L" to the switch SW3 so that the switch SW3 is open. The write control line 51A is connected to the high voltage circuit via the first high voltage line 53A.

The fuse 50 then blows due to the high voltage. Then, when the processor 20 outputs a control signal "L" to the control line 34, the switch SW1 opens and the switch SW3 closes. After that, even if the processor 20 outputs write enable signals to the write control line 51A, since the fuse 50 is blown, the write enable signals do not reach the control circuit 46. Accordingly, the flash memory controller 2 cannot write data in the flash memory chip, i.e., the flash memory chip is now a WORM-set flash memory chip. The flash memory controller 2 can set WORM for each flash memory chip separately.

In order for the flash memory controller 2 to shred the WORM-set flash memory chip, i.e., disable reading of data from the WORM-set flash memory chip in response to a command from the storage controller 4, the processor 20 outputs a control signal "H" to the control line 36. Accordingly, the switch SW2 closes and the switch SW4 opens. Because the read control line 51B is connected to the high voltage circuit via the second high voltage line 53B, a high voltage is applied to the fuse 52 and the fuse 52 blows. After that, even when the switch SW2 opens and the switch SW4 closes and the processor 20 outputs output enable signals to the control line 51, the signals do not reach the control circuit 46. Accordingly, the flash memory controller 2 cannot read the data from the flash memory chip.

Figure 3:
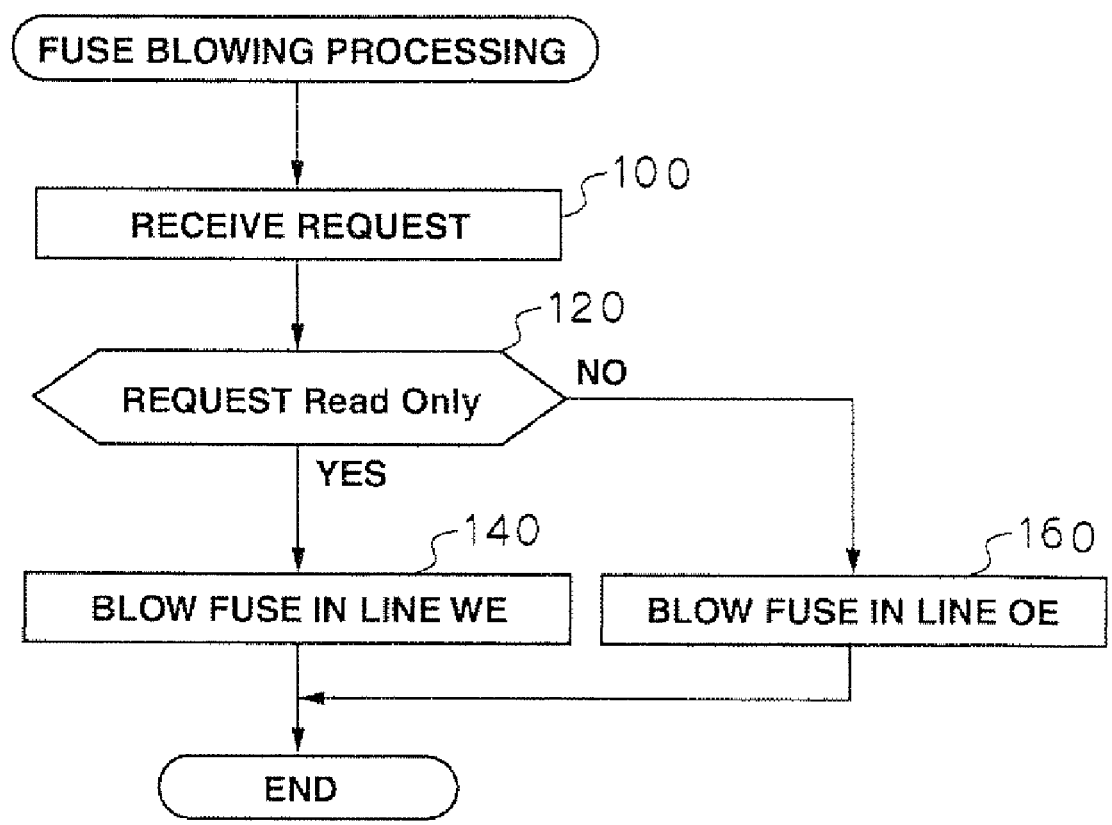
FIG. 3 is a flowchart explaining the operation to blow a fuse (a disconnecting element).

FIG. 3 is a flowchart of the operation the flash memory controller 2 performs to blow the fuses. When the processor 20 in the flash memory controller 2 receives from the processor 4B in the storage controller 4 a request concerning a specific flash memory chip (100), it judges whether or not it is a request to set WORM for the flash memory chip, i.e., a request to make the flash memory chip into a read-only flash memory chip (120). If it is, the processor 20 in the flash memory controller 2 applies a high voltage to the fuse 50 located at a midpoint on the write control line (WE line) to blow it (140). If the request is not a request to set WORM for the flash memory chip, it blows the fuse 52 located at a midpoint on the read control line (OE line) (160).

Figure 19:
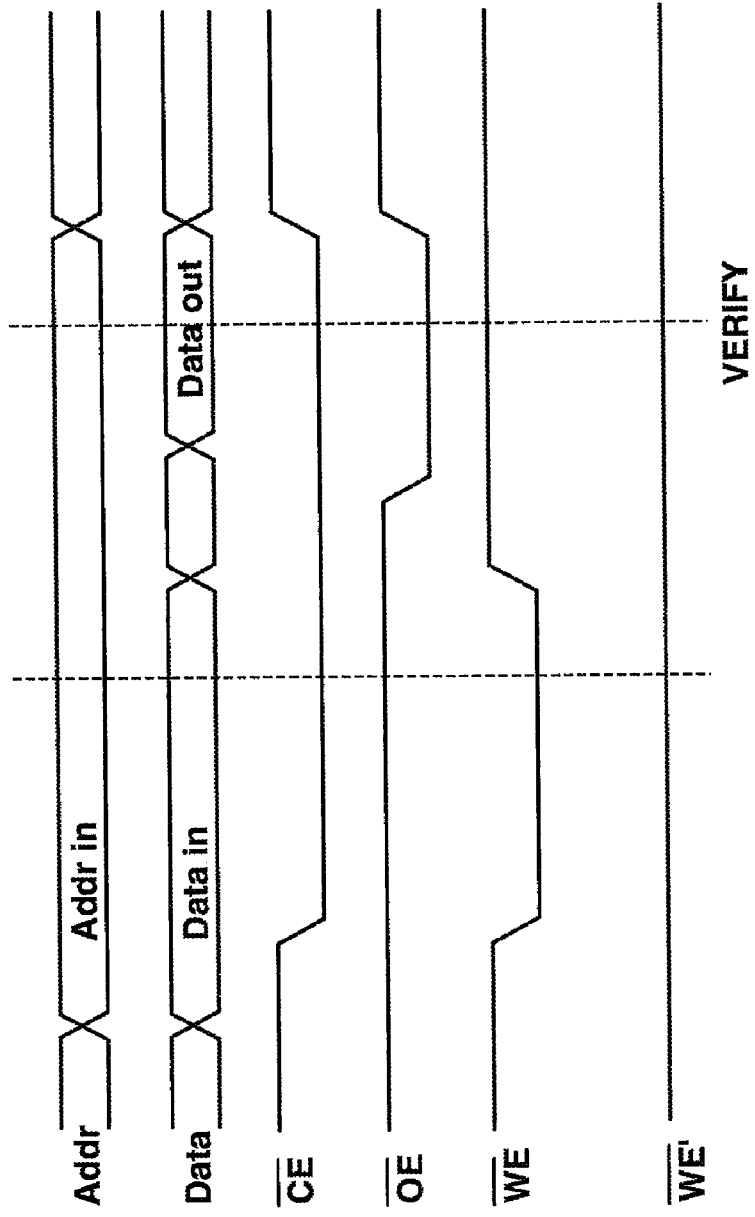
FIG. 19 is a timing chart showing the operation to write data to a WORM-set flash memory chip.
Figure 20:
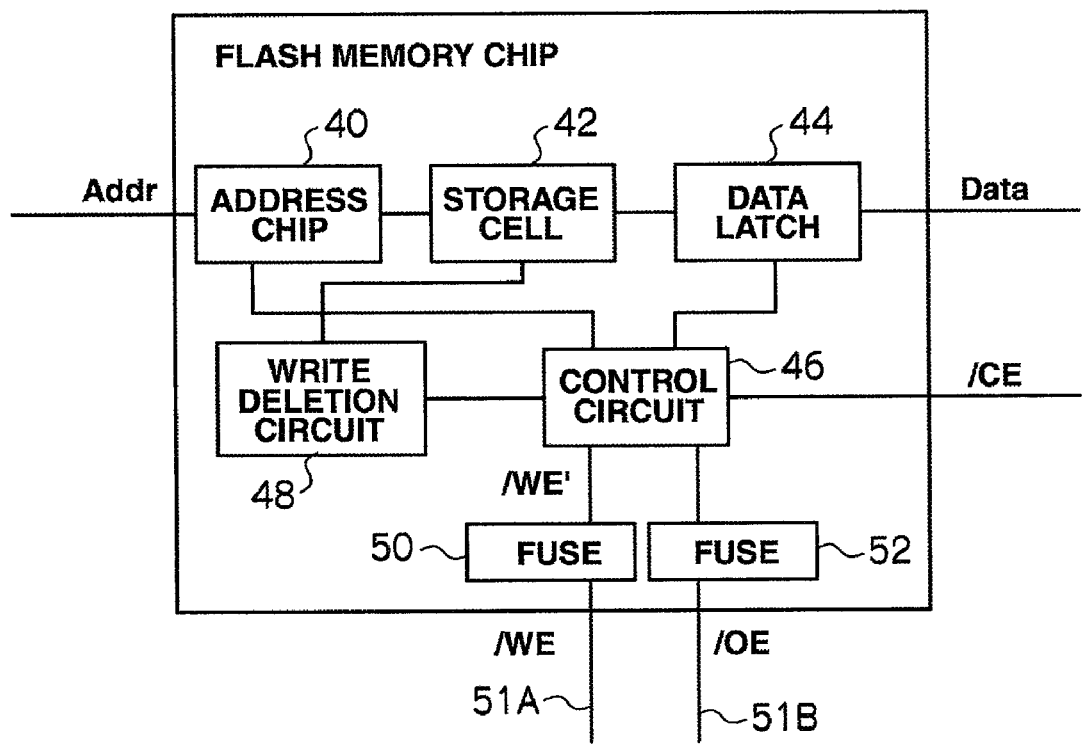
FIG. 20 is a hardware block diagram of a flash memory chip.

FIG. 20 is a block diagram of the flash memory chip C1 shown in FIG. 2. FIG. 19 is a timing chart showing the operation to write data to a flash memory chip. The timing chart in FIG. 19 is explained with reference to FIG. 20.

In FIG. 19, "Addr in" indicates the state where an address is input to and latched by the flash memory chip, "Data in" indicates the state where data is input to and latched by the flash memory chip. When the flash memory controller 2 switches a chip enable signal (/CE) from High (H) to Low (L) and also switches a write enable signal (/WE) from H to L, data is written in the storage cell 42 in the flash memory chip. However, if the fuse 50 blows, /WE cannot be L, so the data cannot be written in the storage cell 42.

When a output enable signal (/OE) is switched from H to L and /WE is switched from L to H, the flash memory controller 2 reads the data written in the storage cell 42 (Data out) and verifies it; however, because the data was not written as above, it judges that this is a write error and sends an error message to the storage controller 4.

The storage areas the storage devices 3 provide to the information processor 6 are virtualized. The information processor 6 recognizes the virtualized logical volumes, writes data in the physical areas allocated to these logical volumes, and reads data from the physical areas.

Incidentally, the switches SW1 and SW2, lines 53A and 53B, and high voltage circuit (voltage circuit) constitute the drive circuit for the disconnecting elements (fuses) described in the claims.

FIG. 4 is a management table defining the content of the logical volumes. LDEVs 1 to 5 entered in the storage area section are the logical volumes. Each logical volume is set for the storage area of one storage device or the storage areas of more than one storage device. PGs 1 to 3 are parity groups. Each parity group includes one or more LDEVs. As shown in FIG. 5, a parity group is a storage area for which the RAID level of the logical volumes and the storage capacity are defined. An administrator of the storage system 1 defines parity groups and creates desired LDEVs within those parity groups.

In FIG. 4, an attribute "RW" (Read Write) indicates that data can be both written in or read from an LDEV. "Capacity" is the entire storage capacity allocated to an LDEV. The management tables shown in FIGS. 4 and 5 are set in the control memory 4C in the storage controller 4 by the management computer 8. The storage controller 4 can set WORM for each LDEV. LDEV 4 is a WORM-set logical volume having the attribute R (Read Only). It is possible to use, as the storage devices 3, both storage devices having flash memory chips with fuses 50 and 52 and storage devices having flash memory chips without fuses 50 and 52. The former storage devices have WORM functionality and the latter storage devices have no WORM functionality. WORM is set for each storage device. Accordingly, WORM is set for all the flash memory chips belonging to one storage device.

In order to set WORM for an LDEV, it is necessary to migrate the storage areas of the LDEV from the storage device(s) with no WORM functionality to the storage device(s) with the WORM functionality. This migration has two types: migration of all the data in a LDEV from the current storage devices to other storage devices; and migration of some pieces of data in a LDEV from current storage devices to others. The migration destination storage device(s) have the WORM functionality.

Figure 6:
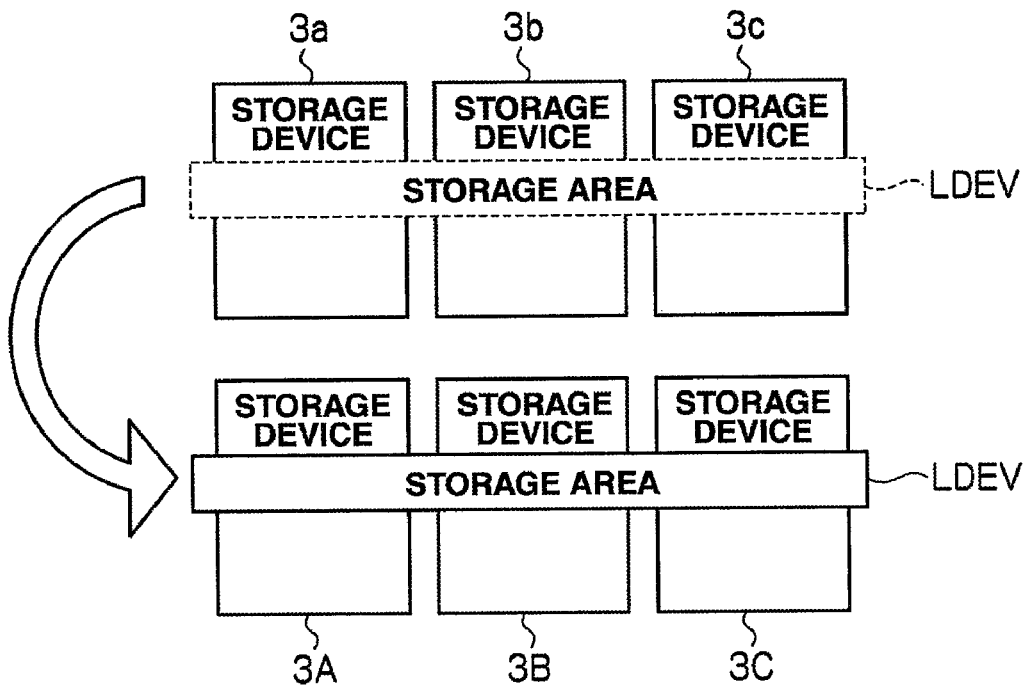
FIG. 6 is a block diagram showing the operation involved in migration of the logical volumes (LDEVs).

For example, as shown in FIG. 6, if an LDEV is set for a plurality of storage devices with no WORM functionality, i.e., the storage devices (3a, 3b, and 3c) having no fuses like those described above and enabling both writing and reading of data at any time, the storage controller 4 migrates that LDEV to the storage devices (3A, 3B and 3C) with WORM functionality respectively.

Figure 7:
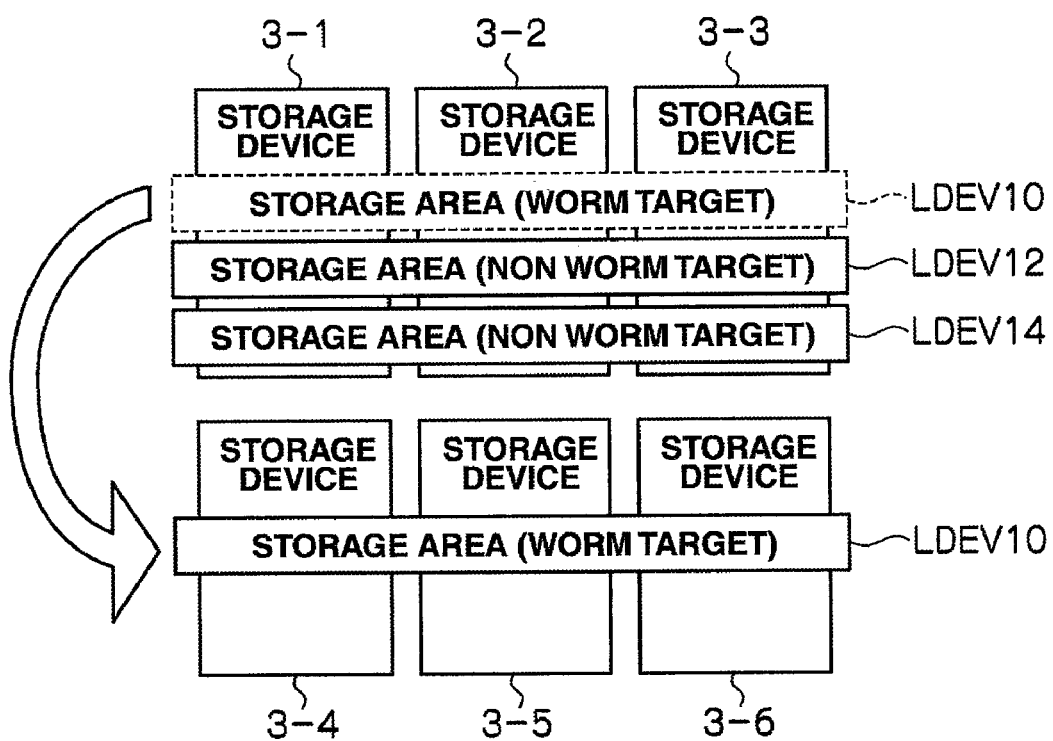
FIG. 7 is a block diagram showing another example of the operation involved in migration of the logical volumes (LDEVs).

Meanwhile, as shown in FIG. 7, when a WORM target LDEV 10 and non-target LDEV 12 and non-target LDEV 14 are set for the same plurality of storage devices 3-1, 3-2, and 3-3, the storage controller 4 compares the capacity of the LDEV 10 and the total capacity of LDEV 12 and LDEV 14. If the total capacity of the non-WORM-target LDEV 12 and LDEV 14 is larger than that of the WORM-target LDEV 10, the storage controller 4 migrates the LDEV 10 to other storage devices 3-4, 3-5 and 3-6 with WORM functionality.

Figure 8:
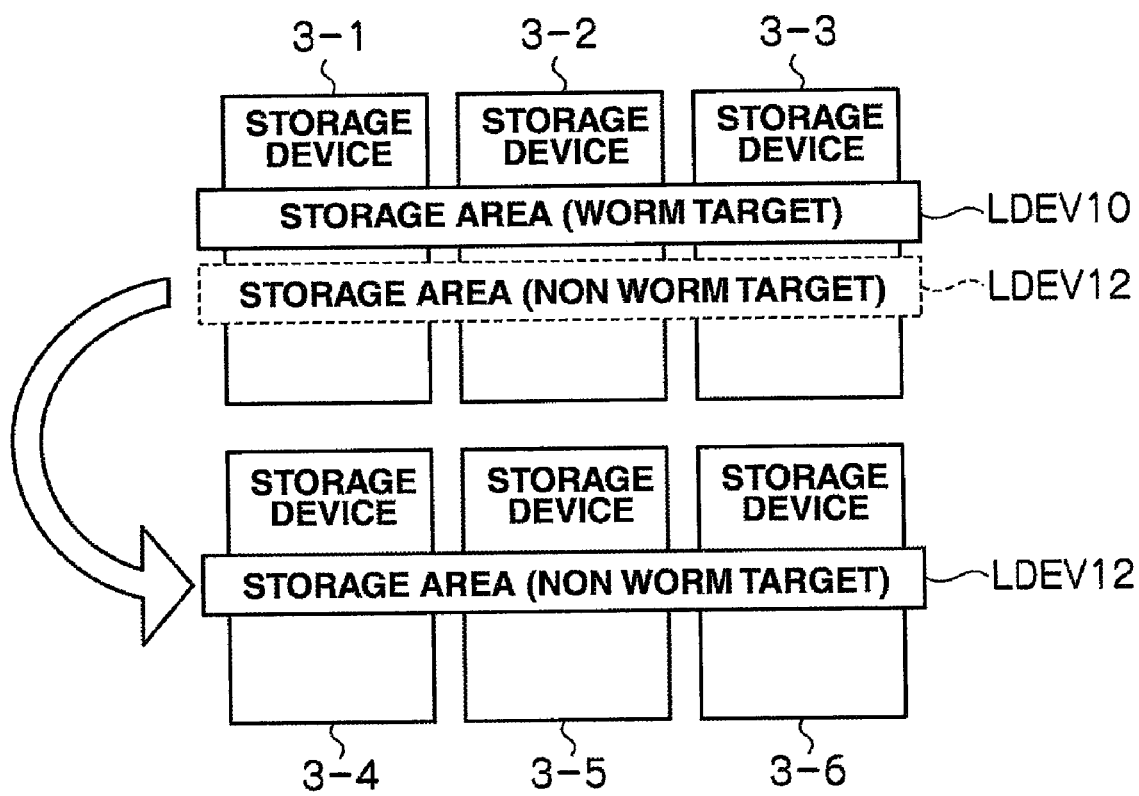
FIG. 8 is a block diagram showing yet another example of the operation involved in migration of the logical volumes (LDEVs).

As shown in FIG. 8, if the storage capacity of the WORM-target LDEV 10 is larger than that of the non-WORM-target LDEV 12, the storage controller 4 migrates the LDEV 12 to the other storage devices 3-4, 3-5 and 3-6.

Minimization of the number of WORM-set storage devices may be achieved, when migrating the data in a LDEV from one storage device to another storage device, by reducing the RAID level of the post-migration LDEV compared to that of the pre-migration LDEVI. For example, when the RAID level of an LDEV is changed from RAID 1 to no RAID level, that LDEV requires no storage areas for serving as a mirror and it is also unnecessary to set WORM for the mirror-providing storage areas.

FIG. 9 is an example of the management table for storage devices 3. PDEVs 1 to 11 correspond to separate storage devices 3. The "attribute" is the feature of the storage devices 3—whether data can be written/read to/from the storage devices 3. "RW" indicates that both reading and writing of data by the information processor 6 is allowed. "R" indicates that only reading of the data (Read Only) is allowed. "S" indicates that neither writing nor reading of the data is allowed, i.e., the storage device is shredded.

"Attribute change date" indicates the date and time when the attribute was changed. "Retention time limit" indicates the time limit the storage device can hold the data properly. For example, WORM is set for PDEV 5 and the attribute of PDEV 5 is changed from RW to R. This change was made on Jul. 12, 2006. Its data retention time limit is Jul. 12, 2016, which is ten years after the attribute change date.

"Set" entered in the WORM function section means that the flash memory chips belonging to that storage device 3 include at least the fuse 50 from among the fuses 50 and 52. If there is no fuse 52, that storage device cannot be shredded.

"None" entered in the WORM function section means that the flash memory chips belonging to that storage device 3 do not have at least fuse 50, of the fuses 50 or 52. "PG" refers to the parity groups as mentioned above. For example, as shown in FIG. 5, PG 4 is set as a RAID 5 parity group having a storage capacity of 800 G. PDEVs 8, 9, 10 and 11—storage devices—each have a storage capacity of 200 G, and together they form PG 4 (total storage capacity of 800 G).

"N/A" entered for PDEV 6 indicates that the PDEV 6 has been shredded and no longer provides a parity group. "N/A" entered for PDEV 7 indicates that PDEV 7 is unused. Just like the management tables in FIGS. 4 and 5, the management table in FIG. 9 is set in the control memory 4C by the administrator of the storage system 1 using the management computer 8.

FIG. 10 is a mapping management table showing which LDEV is mapped to which storage devices (PDEVs). For example, LDEV 5 is set for PDEVs 8 to 11. LDEVs 1 and 2 are set for PDEV 1. This mapping management table is also set in the control memory 4C by the management computer 8. The processor 4B in the storage controller 4 converts access from the information processor 6 to an LDEV to access to a corresponding PDEV by referring to the mapping management table. One parity group is set for one storage device (PDEV)

Figure 11:
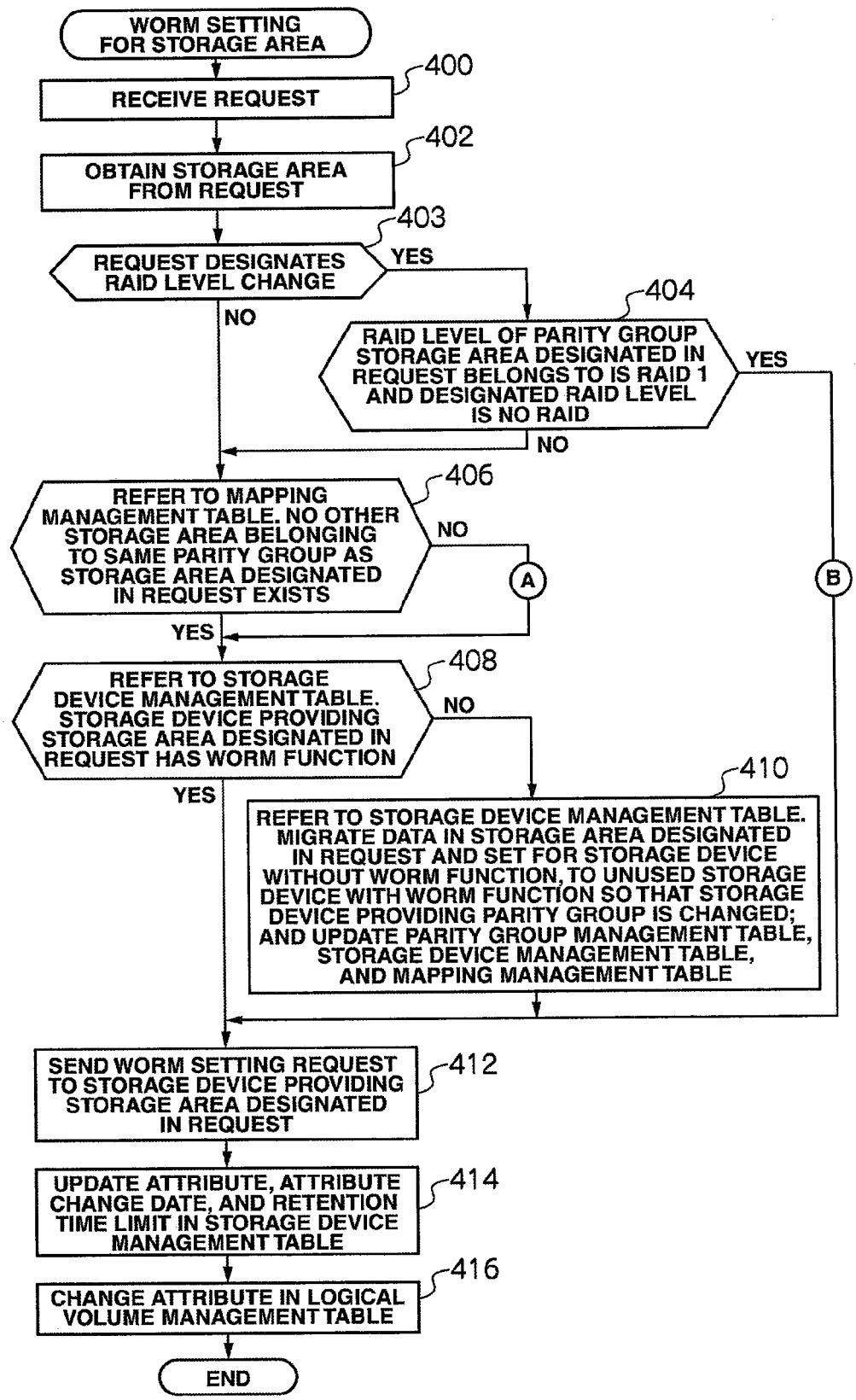
FIG. 11 is a flowchart explaining the operation to set WORM for a logical volume (LDEV).

FIG. 11 shows the flow of the operation to provide write limitation to a storage area (LDEV) and set WORM for this storage area. As described above, in order to set WORM for the storage area, the flash memory controller 2 blows the fuses 50 located at midpoints in the write control lines inside the flash memory chips in the storage devices 3 providing that storage area.

When the storage controller 4 receives a request to set WORM for the storage area (LDEV) (400) from the management computer 8, it obtains the WORM setting target storage area from the request (402). Then it checks whether or not the request designates RAID level change (403).

Figure 12:
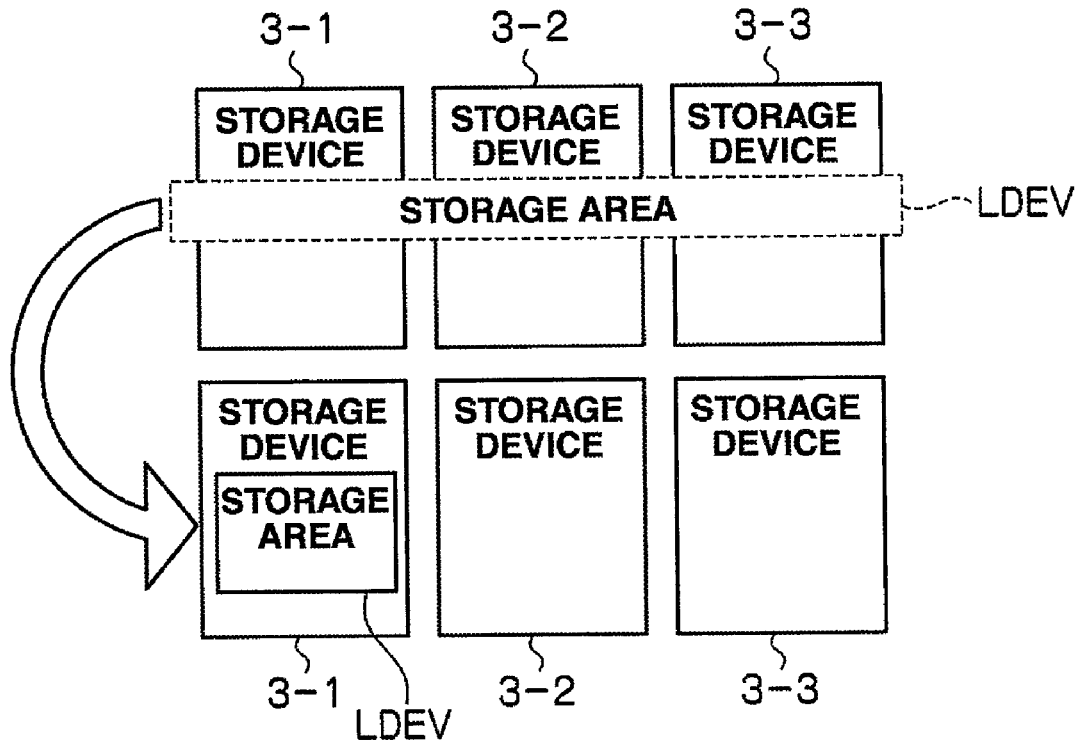
FIG. 12 is a block diagram explaining that the RAID level of an LDEV is reduced during migration.

When setting WORM for the storage area, the management computer 8 may make a request to the storage system 1 to change the RAID level of the post WORM setting storage area. Changing the RAID level is to, for example, make the RAID level of the post-WORM setting storage area lower than that of the pre-WORM setting storage area. FIG. 12 shows a case where the RAID level (RAID 5) of the LDEV set for the storage devices 3-1, 3-2 and 3-3 is reduced to no RAID level.

The storage controller 4 migrates the pieces of data in the LDEV that are stored in the storage devices 3-2 and 3-3 to the storage device 3-1 so that all the pieces of data belonging to the LDEV are aggregated in the storage device 3-1. For example, when the storage devices 3-2 and 3-3 do not have WORM functionality and the storage device 3-1 has WORM functionality, the RAID level of the storage area (LDEV) may be reduced so that WORM can be set for the storage area. In FIG. 12, WORM is set only for the storage device 3-1, so there is an advantage in that the number of storage devices WORM should be set for can be minimized.

Figure 13:
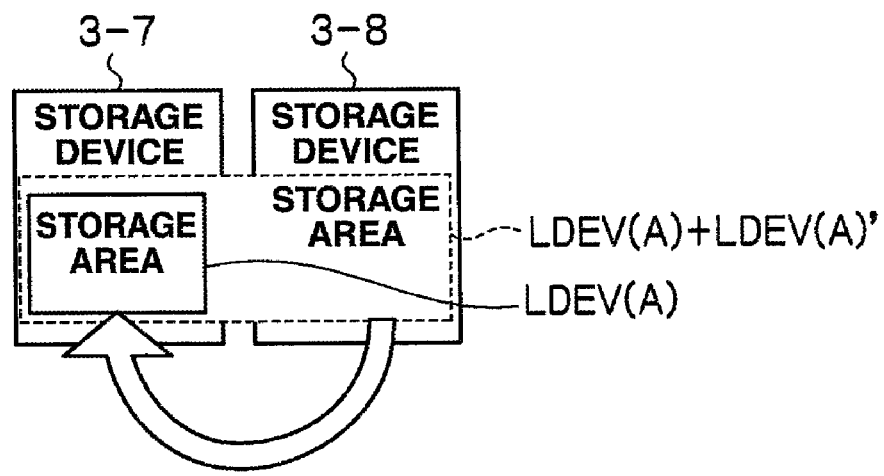
FIG. 13 is a block diagram explaining an example differing from FIG. 12.

After the storage controller 4 checks that the RAID level of the parity group the storage area designated in the WORM setting request belongs to is RAID 1 and that the requested RAID level is no RAID level (404), it proceeds to the procedure explained later with reference to FIG. 15. Incidentally, in FIG. 13, the storage device 3-7 has an LDEV (A) and the storage device 3-8 has an LDEV (A)' which is a mirror of the LDEV (A). The storage controller 4 purges the LDEV (A)' in the storage device 3-8 as shown with the arrow ⇒ and cancels the mirroring between the LDEV (A) and LDEV (A)'. Change from RAID 5 to RAID 0 is carried out the same way as described in FIG. 15 except for step 430. This change involves no mirror cancellation (release of the storage area in the storage device 3-8) but data aggregation/migration (the same process as step 420).

When the WORM setting request does not designate RAID level change or when it requires any RAID level change other than a change to no RAID level in the situation where the RAID level of the parity group of the storage area designated in the WORM setting request is RAID 1 the storage system 1 refers to the mapping management table shown in FIG. 10 and judges whether or not there are any other storage areas belonging to the same parity group as the storage area designated in the WORM setting request (406). This judgment is made in order to not set WORM for the storage devices providing the other storage areas belonging to the same parity group as the designated storage area.

Figure 14:
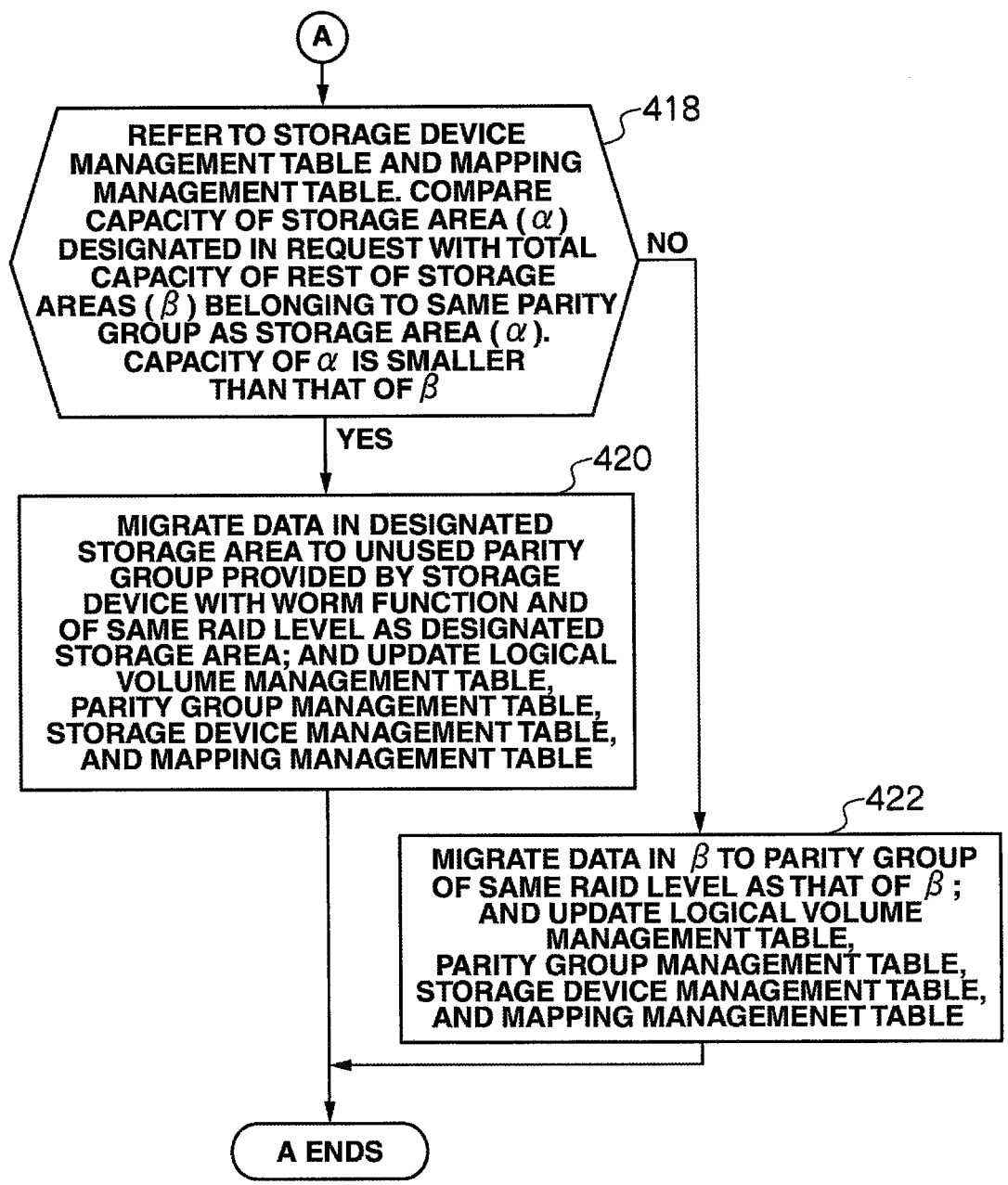
FIG. 14 is a flowchart describing details of a part of the flowchart in FIG. 11.

If the judgment is negative, the storage controller 4 carries out the processing shown in FIG. 14. If the judgment is positive, the storage controller 4 refers to the storage device management table shown in FIG. 9 and judges whether or not the storage devices providing the storage area designated in the WORM setting request have WORM function (408).

If the judgment in 408 is positive, the storage controller 4 sends, to the flash memory controllers 4 in the storage devices providing the storage area designated in the WORM setting request, a request to set WORM for the storage devices (412). The storage controller 4 changes, just as PDEV 5 in the storage device management table in FIG. 9, the attribute of the storage area from RW (Readable, Writable) to R (Readable, non-Writable), updates and registers the attribute change date and the retention time limit for the data in the storage device management table (FIG. 9) (414). It also changes the attribute of the designated storage area from RW to R just as LDEV 4 in the logical volume management table in FIG. 4 (416).

When the storage controller 4 makes a negative judgment in step 408, it refers to the storage device management table in FIG. 9, and migrates the data in the storage area designated in the WORM setting request and provided by the storage devices having no WORM functionality, to unused storage devices with WORM functionality, thereby changing the storage devices providing the parity group. The storage controller 4 then updates the parity group management table, storage device management table, and mapping management table (410).

If the judgment in step 406 is negative, the storage controller 4 carries out the processing shown in FIG. 14. With reference to the storage device management table (FIG. 9) and mapping management table (FIG. 10), it compares the capacity of the storage area (α) designated in the WORM setting request with the total capacity of the rest of the storage areas (β) belonging to the same parity group the storage area belongs to; and judges whether or not the storage capacity of α is smaller than that of β (418). This comparison is made to determine which storage area should be migrated from the current storage device to another in order to minimize the amount of data to migrate.

If the judgment is negative, i.e., when the total storage capacity of β is smaller than that of α, the storage controller 4 migrates the data in the storage areas (β) to one or more storage devices providing an unused parity group of the same RAID level as the storage areas (β). Then, the storage controller 4 updates the logical volume management table (FIG. 4), parity group management table (FIG. 5), storage device management table (FIG. 9) and mapping management table (FIG. 10) (422). The reason for migrating the data in the storage areas (β), not the data in the storage area (α) is because the amount of data to migrate is smaller.

When the judgment in step 418 is positive, the storage controller 4 migrates the data in the designated storage area (α) to one or more storage devices with WORM functionality providing an unused parity group of the same RAID level as the designated storage area (α). Then the storage controller 4 updates the logical volume management table, parity group management table, storage device management table, and mapping management table (420). The reason why the storage controller 4 migrates the data in the storage area (α) is because the amount of data to migrate is smaller than the amount of data in the storage areas (β).

Figure 15:
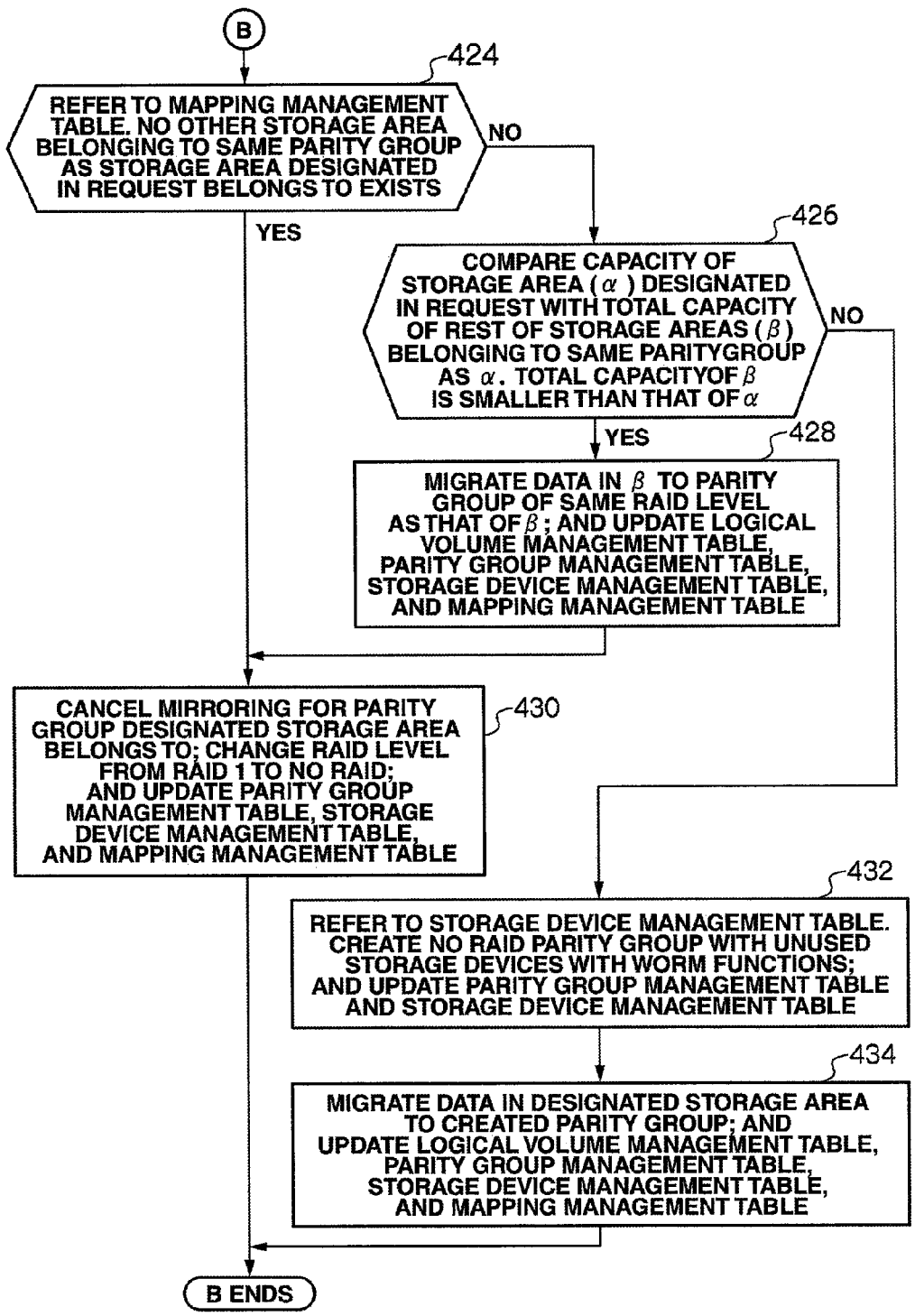
FIG. 15 is a flowchart describing details of another part of the flowchart in FIG. 11.

When the judgment in step 404 in FIG. 11 is positive, the processing proceeds to the procedure in FIG. 15. The storage controller 4 refers to the mapping management table in FIG. 10 and judges whether there are no storage areas belonging to the same parity group as the storage area designated in the WORM setting request (424).

If the judgment is negative, the storage controller 4 compares the capacity of the storage area (α) designated in the WORM setting request with the total capacity of the rest of the storage areas (β) belonging to the same parity group as the requested storage area (α), and judges whether or not the total capacity of the storage areas (β) is smaller than that of the storage area (α) (426).

If the judgment is positive, the storage controller 4 migrates the data in the storage areas (β) to a parity group of the same level as the storage areas (β); and updates the logical volume management table (FIG. 4), parity group management table (FIG. 5), storage device management table (FIG. 9), and mapping management table (FIG. 10) (428).

Then, the storage controller 4 cancels the mirror of the parity group of the designated storage area, changes the RAID level from RAID 1 to NO RAID, and updates the parity group management table (FIG. 5), storage device management table (FIG. 10), and mapping management table (FIG. 10) (430). If the judgment in step 426 is negative, the storage controller 4 refers to the storage device management table (FIG. 9); creates a parity group of no RAID level in unused storage devices having WORM functionality; and updates the parity group management table (FIG. 5) and storage device management table (FIG. 9) (432).

Then, the storage controller 4 migrates the data in the storage area (α) designated in the WORM setting request to the parity group created in step 432 and updates the logical volume management table (FIG. 4), parity group management table (FIG. 5), storage device management table (FIG. 9), and mapping management table (FIG. 10) (434).

Figure 16:
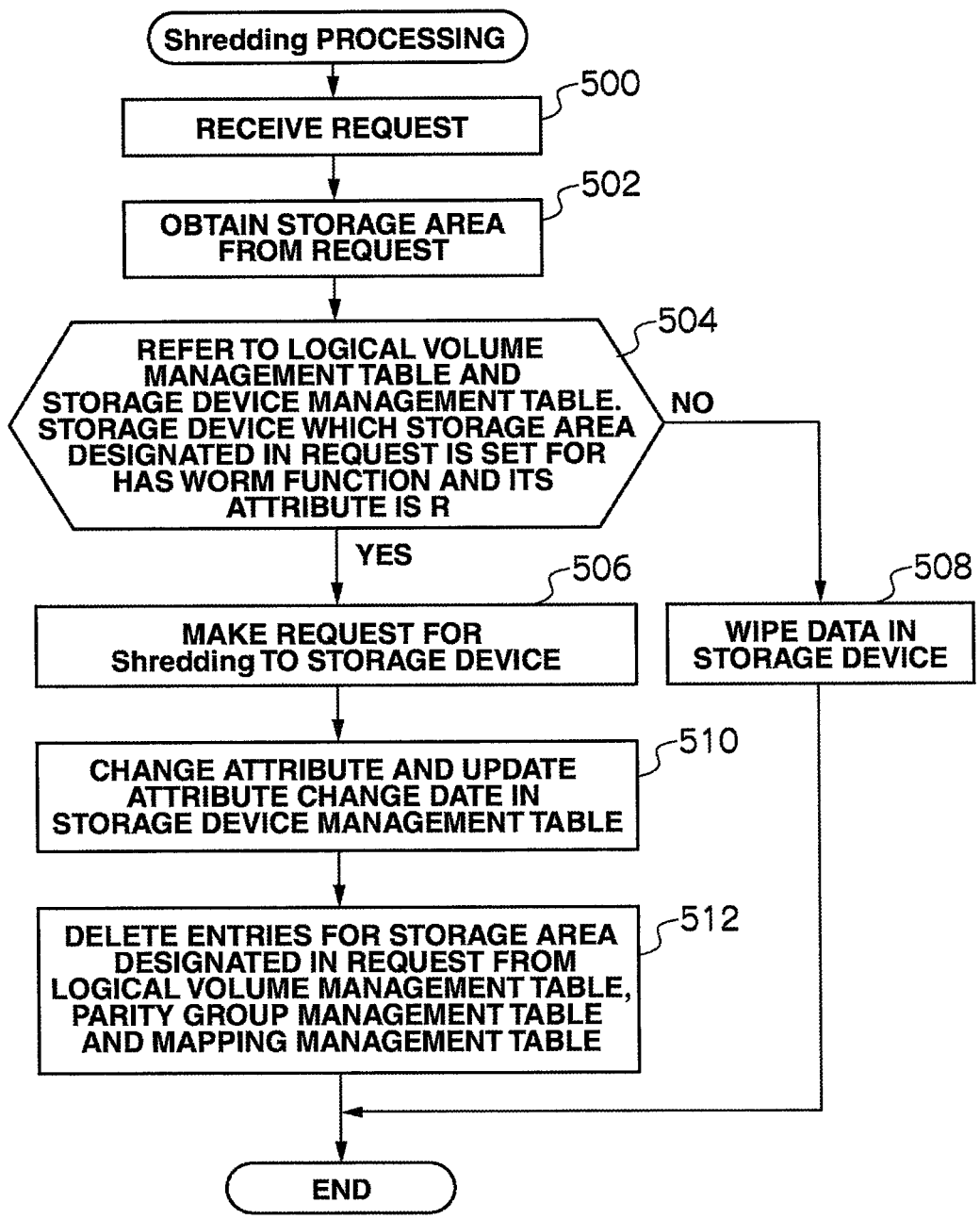
FIG. 16 is a flowchart showing the operation to abandon the data stored in a storage device.

FIG. 16 is a flowchart showing the operation to shred data. When the storage controller 4 receives a data shred request from the management computer 8 (500), it obtains the shred target storage area (LDEV) from this request (502). It then refers to the logical volume management table (FIG. 4) and storage device management table (FIG. 9) and checks whether or not the storage devices providing the storage area designated in the data shred request have WORM functionality and their attributes are R (Readable, Non-Writable) (504).

If the judgment in step 504 is positive, the flash memory controller, having received a data shred request from the storage controller 4, makes a request to the storage devices to shred the data (506). In other words, the flash memory controllers 2 apply high voltages to the read control lines 51 B to blow the fuses 52 located at midpoints in the control lines 51 B.

The storage controller 4 changes the attribute in the storage device management table (FIG. 9) to "S" and updates the attribute change date and the retention time limit (510). It also deletes the entries for the designated storage area from the logical volume management table (FIG. 4), parity management table (FIG. 5), and mapping management table (FIG. 10) (512).

When the storage controller 4 makes a negative judgment in step 504, because the attributes of the storage devices with WORM functionality are RW (Readable, Writable), the flash memory controllers 2 do not have to blow the fuses 52 but only have to wipe the data in all the areas in their storage cells, i.e., write "0" in all the areas in the storage cells.

Figure 17:
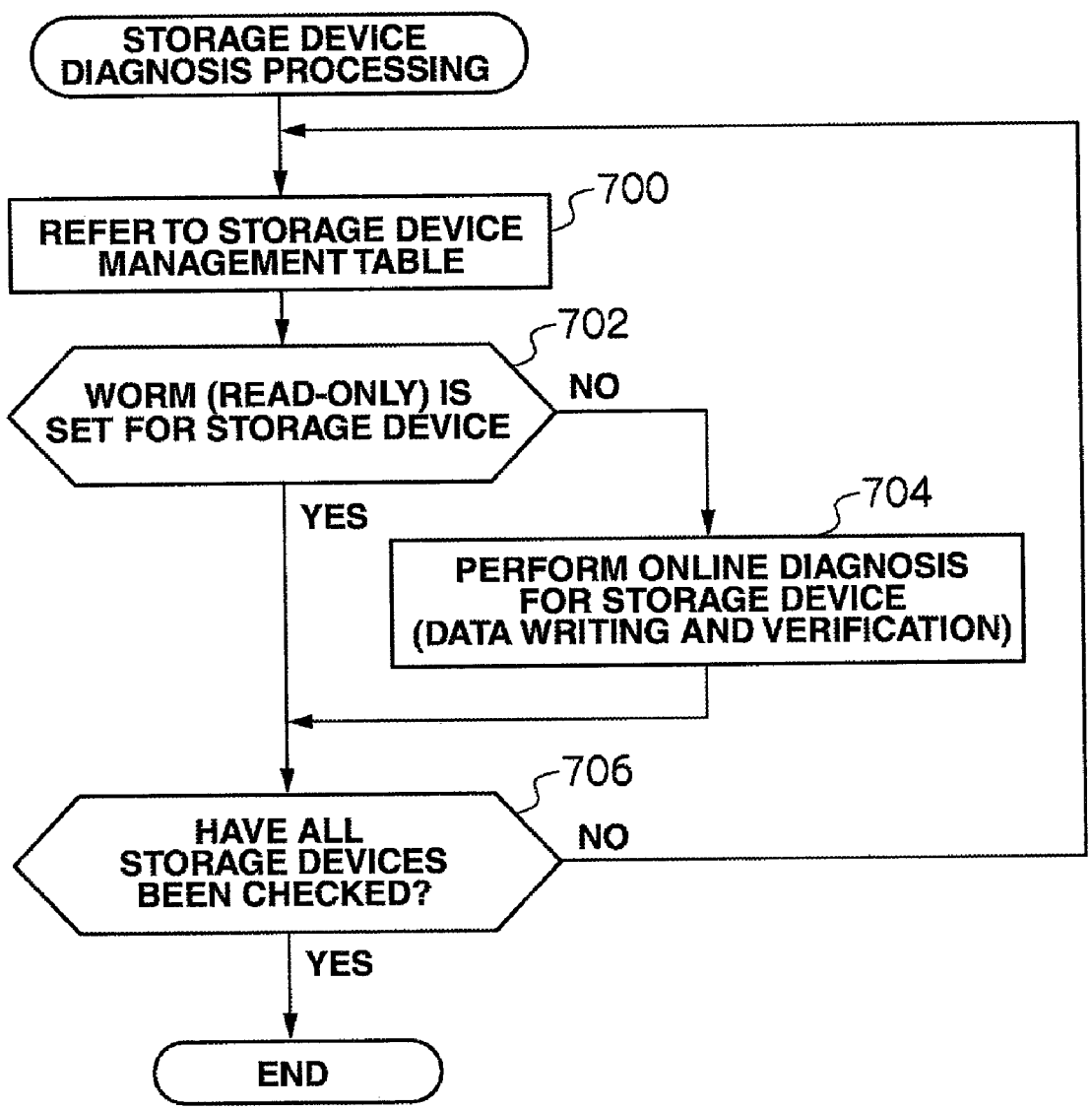
FIG. 17 is a flowchart explaining the diagnosis processing performed for a storage device.

FIG. 17 is a flowchart explaining the diagnosis processing the storage controller 4 performs for a storage device. The processor 4B in the storage controller 4 follows this flowchart at regular time intervals, for example, once every few hours. The processor 4B performs the failure diagnosis processing in order to find a faulty storage device at an early state.

The storage controller 4 refers to the storage device management table (FIG. 9) (700) and checks whether or not WORM is set for a diagnosis target storage device, i.e., whether or not the attribute of the diagnosis target storage device is Read-only (702). If the judgment is positive, the storage controller 4 does not carry out the diagnosis for the target storage device and instead judges whether or not it has checked all the storage devices (706), and if not, it returns to step 700 to check the next storage device as to whether or not WORM is set for it. If the judgment in step 706 is positive, it terminates the processing.

In step 702, when WORM is not set for the diagnosis target storage device, the storage controller 4 carries out online diagnosis, i.e., data writing and verification, for that storage device (704). Accordingly, with this processing, all the storage devices can be checked in a short time, without having to carry out the diagnosis processing for WORM-set storage devices.

Figure 18:
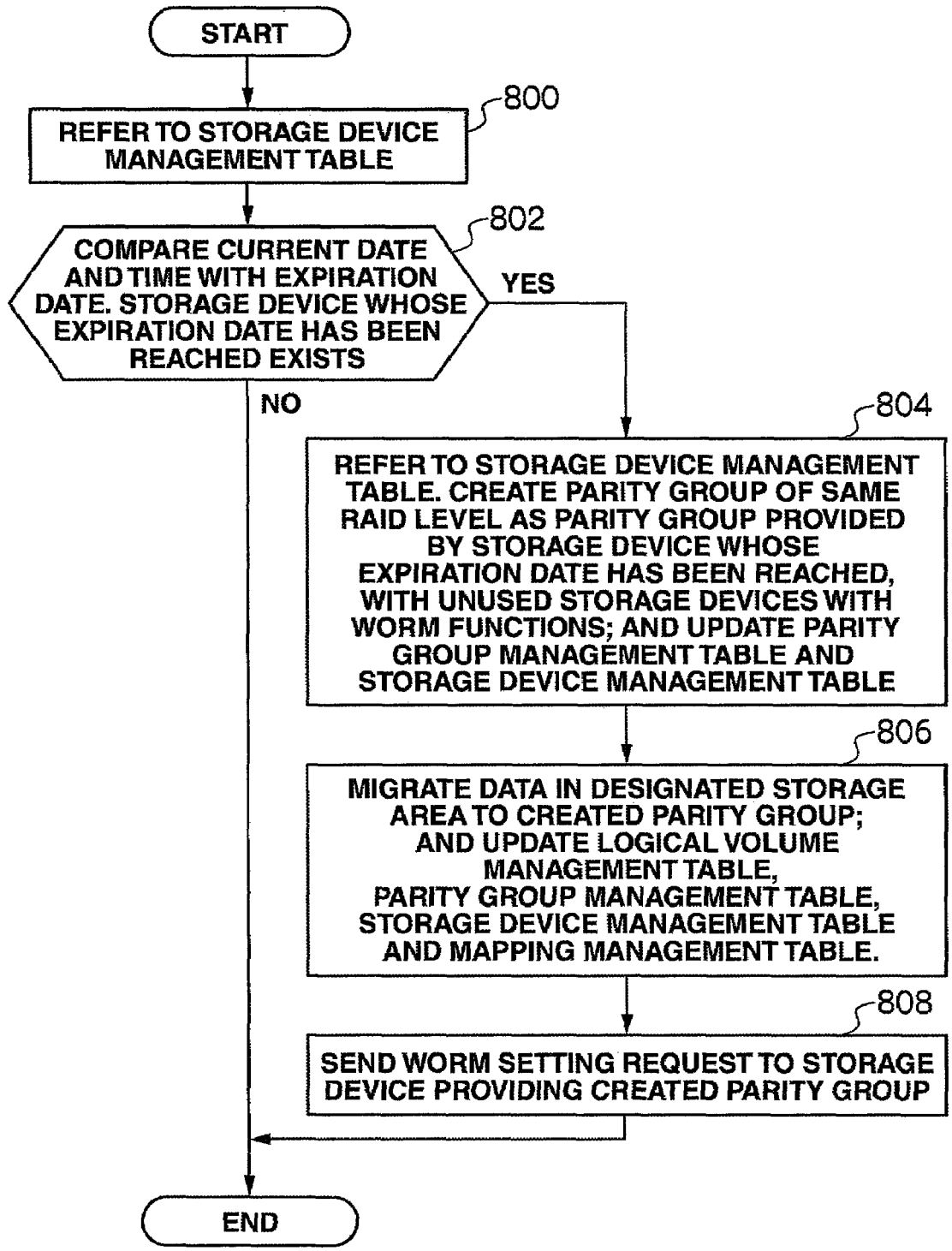
FIG. 18 is a flowchart explaining the operation to extend the term a WORM-set storage device can preserve data.

The operation to extend the expiration date of a WORM-set storage device is explained. FIG. 18 is a flowchart for that operation. The storage controller 4 follows this flowchart at regular time intervals, for example, once a day. As shown in the storage device management table in FIG. 9, a data retention time limit is set for each WORM-set storage device.

The storage controller 4 refers to the storage device management table in FIG. 9 (800). Then it checks whether or not there is a storage device whose retention time limit has been reached (802). If it judges that there is no such storage device, it terminates the processing in the flowchart in FIG. 18. Meanwhile, if it judges that there is such a storage device, it refers to the storage device management table in FIG. 9; creates, with unused storage device(s) having WORM functionality, a parity group of the same RAID level as the parity group provided by the storage device(s) whose retention time has been reached; and updates the parity management table (FIG. 5) and storage device management table (FIG. 9) (804).

The storage controller 4 then migrates the data in a designated storage area to the created parity group and updates the storage device management table (FIG. 9), logical volume management table (FIG. 4), and mapping management table (FIG. 10) (806).

Then, the storage controller 4 sends a WORM setting request to the storage device(s) providing the created parity group (808). Through these steps, the storage area is migrated from the storage device whose data retention time limit has been reached to another storage device(s), consequently, the data retention time limit of the WORM-set storage device can be extended.

In the foregoing embodiment, the storage devices are set as PDEVs, however, the flash memory chips may be set as PDEVs and WORM may be set in units of flash memory chips. Moreover, in place of flash memory, semiconductor memory may be used as storage devices. Incidentally, any modification a person skilled in the art could think of may be added to the foregoing embodiment.

What is claimed is:

1. A storage system having a storage device and a first controller that controls data transmission between the storage device and an information processor,
   wherein the storage device comprises:
   a storage area;
   a control circuit for controlling the writing of data to the storage area and the reading of the data from the storage area;
   a second controller for outputting a first control signal for executing data writing to the control circuit through a first control line; and outputting a second control signal for executing data reading to the control circuit through a second control line;
   a disconnecting element, which is located at a midpoint on at least the first control line, from among the first and second control lines, for disconnecting the control line; and
   a drive circuit for driving the disconnecting element, and
   based on a command from the first controller, the second controller outputs to the drive circuit a third control signal for disconnecting the control line using the disconnecting element, wherein
   the first controller provides a plurality of logical volumes to the information processor;
   a specific logical volume to be write protected is set from among the logical volumes;
   a storage device providing the storage area to the write-protected logical volume is specified; and
   the first control line in the specified storage device is disconnected by the disconnecting element.

2. The storage system according to claim 1, wherein
   the storage system includes another storage device having no disconnecting element; and
   when it is assumed that a storage device having the disconnecting element is a first storage device and the above other storage device having no disconnecting element is a second storage device, if the specific logical volume exists in the second storage device, the first controller migrates the data in the second storage device providing the specific logical volume to the first storage device; and disconnects the first control line in the first storage device using the disconnecting element.

3. The storage system according to claim 2, wherein the first storage device in which the first control line is to be disconnected by the disconnecting element provides a storage area for another logical volume other than the specific logical volume, the first controller migrates that other logical volume to another storage device.

4. The storage system according to claim 1, wherein another logical volume is allocated to the storage device providing a storage area for the specified logical volume, the first controller compares the storage capacity of the specific logical volume with the storage capacity of the other logical volume and migrates the logical volume having smaller storage capacity to another storage device.

5. The storage system according to claim 1, wherein the first controller changes a RAID level of the specific logical volume before or after setting write protection to the specific logical volume.

6. The storage system according to claim 5, wherein the first controller reduces the RAID level of the specific logical volume before or after setting write protection to the specific logical volume.

7. A storage system having a storage device and a first controller that controls data transmission between the storage device and an information processor,
   wherein the storage device comprises:
   a storage area;
   a control circuit for controlling the writing of data to the storage area and the reading of the data from the storage area;
   a second controller for outputting a first control signal for executing data writing to the control circuit through a first control line; and outputting a second control signal for executing data reading to the control circuit through a second control line;
   a disconnecting element, which is located at a midpoint on at least the first control line, from among the first and second control lines, for disconnecting the control line; and
   a drive circuit for driving the disconnecting element, and
   based on a command from the first controller, the second controller outputs to the drive circuit a third control signal for disconnecting the control line using the disconnecting element,
   wherein when the first controller diagnoses a plurality of storage devices, it skips a diagnosis step for the storage device whose first control line has been disconnected by the disconnecting element.

8. A storage system having a storage device and a first controller that controls data transmission between the storage device and an information processor,
   wherein the storage device comprises:
   a storage area;
   a control circuit for controlling the writing of data to the storage area and the reading of the data from the storage area;
   a second controller for outputting a first control signal for executing data writing to the control circuit through a first control line; and outputting a second control signal for executing data reading to the control circuit through a second control line;
   a disconnecting element, which is located at a midpoint on at least the first control line, from among the first and second control lines, for disconnecting the control line; and
   a drive circuit for driving the disconnecting element, and
   based on a command from the first controller, the second controller outputs to the drive circuit a third control signal for disconnecting the control line using the disconnecting element,
   wherein data retention time limits are set for the storage devices whose first control lines have been disconnected by the disconnecting elements; and the first controller refers to these time limits and migrates the data in any storage device whose time limit has been reached to another storage device.

* * * * *